(12) United States Patent
Jeon et al.

(10) Patent No.: US 12,082,452 B2
(45) Date of Patent: Sep. 3, 2024

(54) FLEXIBLE DISPLAY APPARATUS INCLUDING MONITORING AND BUFFERING BANKS

(71) Applicant: Samsung Display Co., Ltd., Yongin-si (KR)

(72) Inventors: Yujin Jeon, Yongin-si (KR); Wonse Lee, Yongin-si (KR); Sukyoung Kim, Yongin-si (KR); Donghyeon Jang, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/310,996

(22) Filed: May 2, 2023

(65) Prior Publication Data

US 2023/0269973 A1 Aug. 24, 2023

Related U.S. Application Data

(62) Division of application No. 17/129,169, filed on Dec. 21, 2020, now Pat. No. 11,758,772.

(30) Foreign Application Priority Data

Feb. 21, 2020 (KR) ........................ 10-2020-0021772

(51) Int. Cl.
*H10K 50/84* (2023.01)
*H10K 50/844* (2023.01)
(Continued)

(52) U.S. Cl.
CPC ......... *H10K 59/124* (2023.02); *H10K 50/844* (2023.02); *H10K 59/122* (2023.02);
(Continued)

(58) Field of Classification Search
CPC .. H10K 50/844; H10K 59/124; H10K 59/122; H10K 59/131; H10K 59/1216;
(Continued)

(56) References Cited

U.S. PATENT DOCUMENTS 9,391,296 B2 7/2016 Park et al.
9,601,717 B2 3/2017 Lee et al.
(Continued)

FOREIGN PATENT DOCUMENTS

KR 10-2015-0025994 3/2015
KR 10-2016-0081106 7/2016
(Continued)

*Primary Examiner* — Ida M Soward
(74) *Attorney, Agent, or Firm* — KILE PARK REED & HOUTTEMAN PLLC

(57) ABSTRACT

A display apparatus includes a display area including pixels; a non-display area adjacent to the display area; a first planarization layer located in the display area and the non-display area; a second planarization layer on the first planarization layer; an organic insulating layer on the second planarization layer; a first dam on the first planarization layer, including the second planarization layer and the organic insulating layer, and surrounding the display area; a second dam disposed outside the first dam, including the second planarization layer and the organic insulating layer, and surrounding the first dam; and a monitoring bank disposed between the display area and the first dam and including the second planarization layer and the organic insulating layer. A thickness of the second planarization layer included in the monitoring bank is less than a thickness of the second planarization layer included in the first dam.

11 Claims, 13 Drawing Sheets

(51) Int. Cl.
  *H10K 59/12* (2023.01)
  *H10K 59/122* (2023.01)
  *H10K 59/124* (2023.01)
  *H10K 59/13* (2023.01)
  *H10K 59/131* (2023.01)
  *H10K 59/40* (2023.01)
  *H01L 27/146* (2006.01)
  *H10K 59/121* (2023.01)
  *H10K 77/10* (2023.01)
  *H10K 102/00* (2023.01)

(52) U.S. Cl.
  CPC ... *H10K 59/131* (2023.02); *G09G 2300/0408* (2013.01); *G09G 2300/0804* (2013.01); *H01L 27/14678* (2013.01); *H05K 2201/09909* (2013.01); *H10K 59/1216* (2023.02); *H10K 59/40* (2023.02); *H10K 77/111* (2023.02); *H10K 2102/00* (2023.02); *H10K 2102/311* (2023.02)

(58) Field of Classification Search
  CPC .. H10K 59/40; H10K 59/1213; H10K 59/123; H10K 59/126; H10K 77/111; H10K 2102/00; H10K 2102/311; H10K 2102/351; H05K 2201/09909; H01L 27/147678; G09G 2300/0408; G09G 2300/0804
  See application file for complete search history.

(56) References Cited

U.S. PATENT DOCUMENTS

| | | | |
|---|---|---|---|
| 9,859,334 B2* | 1/2018 | Kim | H10K 50/8426 |
| 10,454,063 B2 | 10/2019 | Chang et al. | |
| 10,720,604 B2* | 7/2020 | Kim | H10K 59/00 |
| 11,011,590 B2* | 5/2021 | Kim | H10K 50/844 |
| 2015/0091030 A1* | 4/2015 | Lee | H10K 59/122 |
| | | | 438/34 |
| 2016/0307971 A1* | 10/2016 | Jeon | G09G 3/3233 |
| 2017/0331058 A1* | 11/2017 | Seo | H10K 59/50 |
| 2018/0123062 A1* | 5/2018 | Lee | B32B 27/281 |
| 2018/0136527 A1* | 5/2018 | Park | G02F 1/136227 |
| 2018/0151838 A1* | 5/2018 | Park | G06F 3/0412 |
| 2019/0019966 A1* | 1/2019 | Jiang | H10K 77/111 |
| 2019/0181373 A1* | 6/2019 | Kim | H10K 50/822 |
| 2019/0363267 A1* | 11/2019 | Tanaka | H05B 33/02 |
| 2020/0083306 A1* | 3/2020 | Choi | H10K 50/8426 |
| 2020/0106050 A1* | 4/2020 | Jeong | H10K 50/8445 |
| 2020/0136088 A1* | 4/2020 | Yang | G09G 3/3225 |
| 2020/0176520 A1* | 6/2020 | Kim | H10K 50/844 |
| 2020/0185647 A1* | 6/2020 | Lee | H10K 59/122 |
| 2020/0212114 A1* | 7/2020 | Song | G06F 3/0445 |
| 2020/0212115 A1 | 7/2020 | Choi et al. | |
| 2020/0212356 A1 | 7/2020 | Kim et al. | |
| 2020/0335722 A1* | 10/2020 | Kim | H10K 50/844 |
| 2020/0381653 A1 | 12/2020 | Bang et al. | |
| 2020/0403180 A1 | 12/2020 | Seon et al. | |
| 2021/0043715 A1 | 2/2021 | Han et al. | |
| 2021/0057658 A1* | 2/2021 | Chen | H10K 77/111 |
| 2021/0066418 A1 | 3/2021 | Seo et al. | |
| 2021/0175292 A1 | 6/2021 | Bang et al. | |
| 2021/0313544 A1* | 10/2021 | Hirai | H10K 50/8428 |
| 2021/0335948 A1 | 10/2021 | Choi et al. | |
| 2021/0408480 A1* | 12/2021 | Kato | H10K 71/00 |

FOREIGN PATENT DOCUMENTS

| | | |
|---|---|---|
| KR | 10-2017-0138388 | 12/2017 |
| KR | 10-2019-0021981 | 3/2019 |
| KR | 10-2019-0030951 | 3/2019 |
| KR | 10-2019-0052478 | 5/2019 |

* cited by examiner

FLEXIBLE DISPLAY APPARATUS INCLUDING MONITORING AND BUFFERING BANKS

CROSS-REFERENCE TO RELATED APPLICATION

This is a divisional application of U.S. patent application Ser. No. 17/129,169, filed Dec. 21, 2020, now U.S. Pat. No. 11,758,772, the disclosure of which is incorporated herein by reference in its entirety. U.S. patent application Ser. No. 17/129,169 claims priority to and benefit of Korean Patent Application No. 10-2020-0021772 under 35 U.S.C. § 119, filed in the Korean Intellectual Property Office (KIPO) on Feb. 21, 2020, the disclosure of which is incorporated herein in its entirety by reference.

BACKGROUND

1. Technical Field

The disclosure relates to a display apparatus and a flexible display apparatus.

2. Description of the Related Art

Display apparatuses visually display data. Applications of display apparatuses have been diversified recently. Moreover, since the thickness and weight of display apparatuses have been reduced, their range of use has been broadened.

For example, in order to manufacture thin and light display apparatuses, a light-emission region may be encapsulated by using a thin-film encapsulation layer including at least one inorganic encapsulation layer and at least one organic encapsulation layer instead of using an encapsulation substrate formed of a glass material.

The organic encapsulation layer may planarize the upper surface of a display area of the organic light-emitting display apparatus by covering the display area, and may prevent cracking of the inorganic encapsulation layer by covering a portion of a non-display area of the organic light-emitting display apparatus.

In case that the organic encapsulation layer is coated using an inkjet method, there may be a need to check whether a material of the organic encapsulation layer discharged via an inkjet process was disposed at a target location on the non-display area.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

One or more embodiments allow monitoring of a disposing location of a material for forming an organic encapsulation layer by forming a monitoring bank having a height difference between a touch connection line and a dam and observing the definition of the boundary of the monitoring bank. However, the one or more embodiments are only examples, and the scope of the disclosure is not limited thereto.

Additional aspects will be set forth in part in the description which follows and, in part, will be apparent from the description, or may be learned by practice of the embodiments of the disclosure.

According to one or more embodiments, a display apparatus includes a display area including a plurality of pixels; a non-display area adjacent to the display area; a first planarization layer located in the display area and the non-display area; a second planarization layer disposed on the first planarization layer; an organic insulating layer disposed on the second planarization layer; a first dam disposed on the first planarization layer, including the second planarization layer and the organic insulating layer, and surrounding the display area; a second dam disposed outside the first dam, including the second planarization layer and the organic insulating layer, and surrounding the first dam; and a monitoring bank disposed between the display area and the first dam, and including the second planarization layer and the organic insulating layer. A thickness of the second planarization layer included in the monitoring bank is less than a thickness of the second planarization layer included in the first dam.

According to an embodiment, a height from an upper surface of the first planarization layer to an upper surface of the monitoring bank may be less than a height from the upper surface of the first planarization layer to an upper surface of the third dam.

According to an embodiment, the display apparatus may further include a third dam disposed between the first dam and the monitoring bank and including the second planarization layer and the organic insulating layer.

According to an embodiment, the height from the upper surface of the first planarization layer to the upper surface of the monitoring bank may be less than a height from the upper surface of the first planarization layer to an upper surface of the third dam.

According to an embodiment, the display apparatus may further include a thin-film encapsulation layer including a first inorganic encapsulation layer, an organic encapsulation layer disposed on the first inorganic encapsulation layer, and a second inorganic encapsulation layer disposed on the organic encapsulation layer. The organic encapsulation layer may cover the display area and may be disposed inside the second dam. The first inorganic encapsulation layer and the second inorganic encapsulation layer may each extend over the second dam.

According to an embodiment, the display apparatus may further include a touch screen layer disposed on the thin-film encapsulation layer corresponding to the display area; and a touch connection line electrically connected to the touch screen layer and extending to the non-display area. An end of the touch connection line may be located closer to the display area than the monitoring bank is.

According to an embodiment, the display apparatus may further include a first power supply voltage line located in the non-display area and corresponding to an edge of the display area, the first power supply voltage line including a first conductive layer and a second conductive layer disposed on the first conductive layer; and a second power supply voltage line located in the non-display area and spaced apart from the first power supply voltage line, the second power supply voltage line including a third conductive layer and a fourth conductive layer disposed on the third conductive layer.

According to an embodiment, the first dam, the second dam, and the monitoring bank may overlap the second power supply voltage line.

According to an embodiment, the second dam may clad an end of the fourth conductive layer.

According to an embodiment, the first planarization layer may be disposed between the first conductive layer and the second conductive layer, and the first conductive layer and the second conductive layer may electrically contact each other via a first via hole in the first planarization layer.

According to an embodiment, the first planarization layer may be disposed between the third conductive layer and the fourth conductive layer, and the third conductive layer and the fourth conductive layer may electrically contact each other via a second via hole in the first planarization layer.

According to an embodiment, the third conductive layer and the first conductive layer may include a same material, and the fourth conductive layer and the second conductive layer may include a same material.

According to an embodiment, a width of the second power supply voltage line may be greater than a width of the first power supply voltage line.

According to an embodiment, the fourth conductive layer may include an opening that exposes an upper surface of the first planarization layer.

According to an embodiment, the second planarization layer included in the monitoring bank may have a stripe shape in a plan view.

According to an embodiment, the second planarization layer included in the monitoring bank may have a shape in which a plurality of islands are separated from one another in a plan view.

According to one or more embodiments, a flexible display apparatus includes a display area disposed on a substrate and including a plurality of pixels; a non-display area adjacent to the display area and including a bending area; a first dam surrounding the display area; a second dam disposed outside the first dam and surrounding the first dam; a monitoring bank disposed between the display area and the second dam; a buffering bank disposed outside the monitoring bank and covering an opening provided in the substrate in the bending area; a thin-film encapsulation layer covering the display area and a portion of the non-display area; a touch screen layer disposed on the thin-film encapsulation layer; and a touch connection line connected to the touch screen layer and extending to the non-display area, wherein an end of the touch connection line is located closer to the display area than the monitoring bank is.

According to an embodiment, a height of the monitoring bank may be less than a height of the first dam.

According to an embodiment, an organic insulating layer included in the buffering bank may directly contact the substrate via the opening in the bending area.

According to an embodiment, the thin-film encapsulation layer may include a first inorganic encapsulation layer, an organic encapsulation layer disposed on the first inorganic encapsulation layer, and a second inorganic encapsulation layer disposed on the organic encapsulation layer, the organic encapsulation layer may be disposed inside the second dam, and the first inorganic encapsulation layer and the second inorganic encapsulation layer may each extend over the second dam and cover a portion of the buffering bank.

According to an embodiment, an end of the first inorganic encapsulation layer and an end of the second inorganic encapsulation layer may be disposed closer to the display area than the opening is.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1:
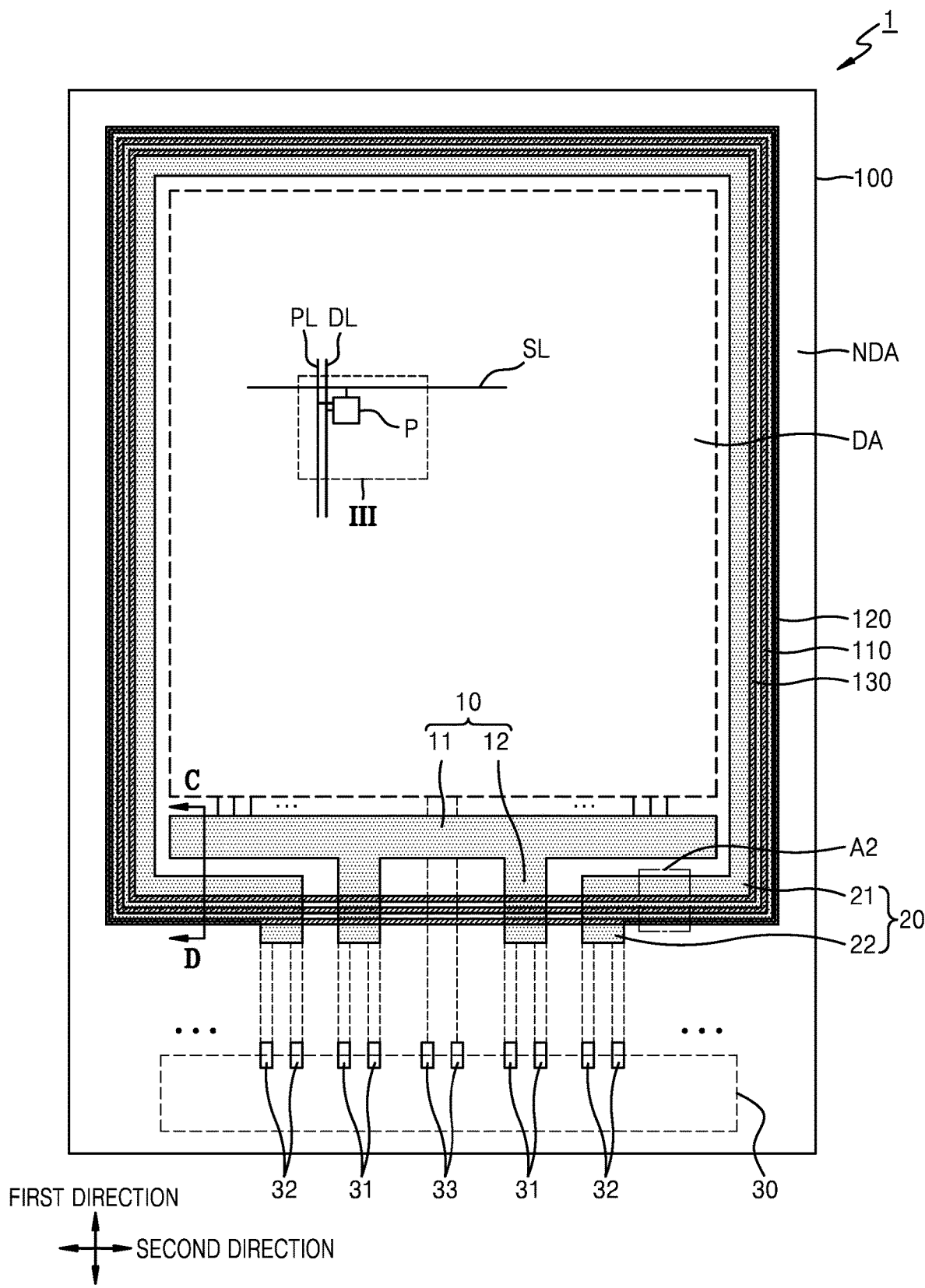
FIG. 1 is a schematic plan view of a display apparatus according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the disclosure. As used herein, the term "and/or" includes any and all combinations of one or more of the associated listed items. Throughout the disclosure, the expression "at least one of A, B and C" indicates only A, only B, only C, both A and B, both A and C, both B and C, all of A, B, and C, or variations thereof. One or more embodiments of the disclosure will be described below in more detail with reference to the accompanying drawings. Those components that are the same or are in correspondence are rendered the same reference numeral regardless of the figure number, and redundant explanations are omitted.

It will be understood that although the terms "first," "second," and the like may be used herein to describe various components, these components should not be limited by these terms. These components are only used to distinguish one component from another.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In the following examples, the x-axis, the y-axis and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

Display apparatuses display an image. Examples of the display apparatuses may include liquid crystal displays (LCDs), electrophoretic displays, organic light-emitting displays, inorganic light-emitting displays, field emission displays, surface-conduction electron-emitter displays, plasma displays, and cathode ray displays.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly defined herein.

Although an organic light-emitting display apparatus will now be illustrated and described as a display apparatus according to an embodiment, the disclosure is not limited thereto and may be applied to various types of display apparatuses.

Figure 2A:
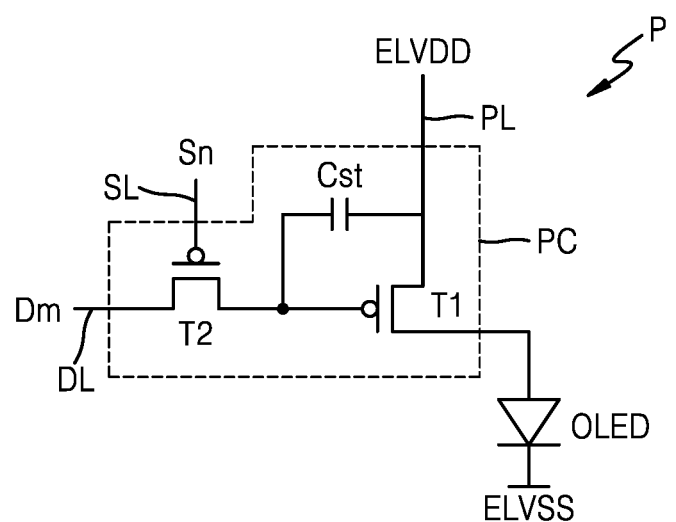
FIGS. 2A and 2B are equivalent circuit diagrams of one pixel included in the display apparatus according to an embodiment.
Figure 2B:
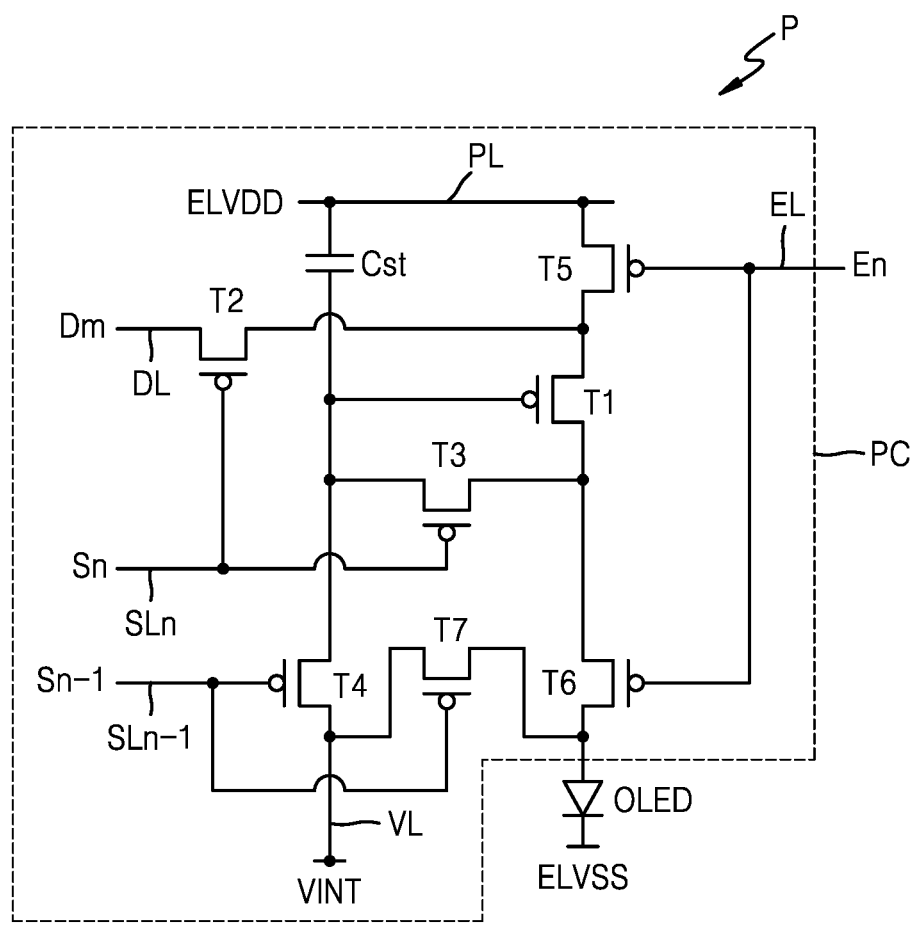
Figure 3:
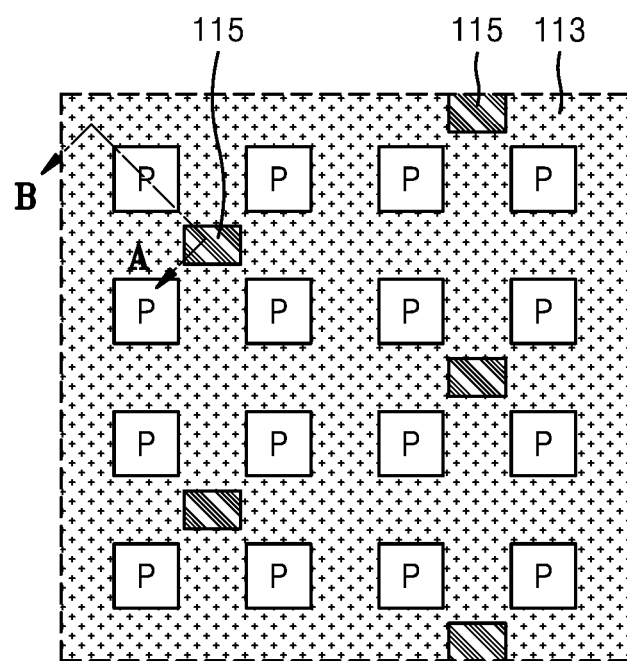
FIG. 3 is a schematic plan view of a portion III of FIG. 1.
Figure 4:
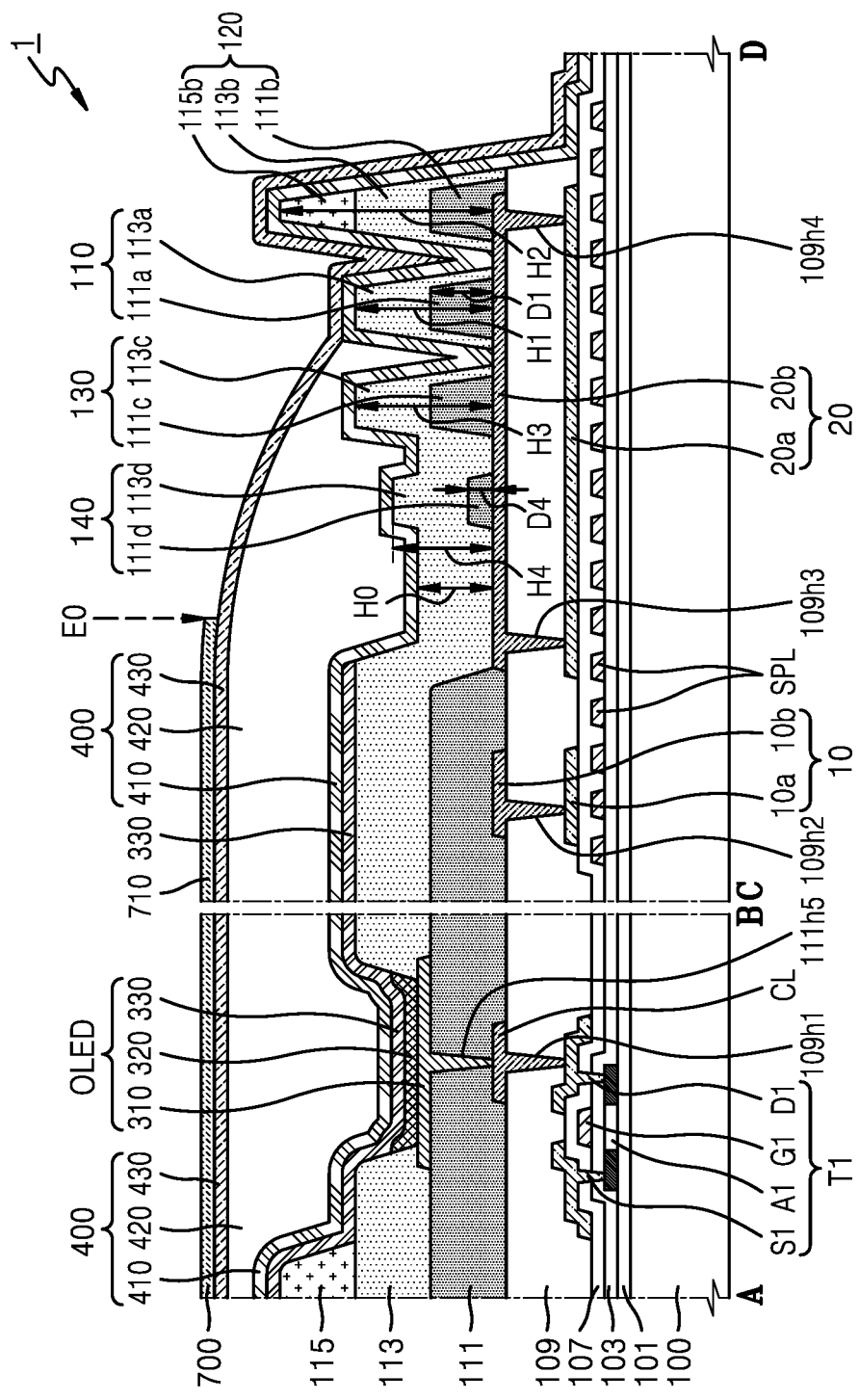
FIG. 4 is a schematic cross-sectional view of the display apparatus of FIG. 1, and illustrates a schematic cross-section of the display apparatus taken along line A-B of FIG. 3 and a schematic cross-section of the display apparatus taken along line C-D of FIG. 1.

FIG. 1 is a schematic plan view of a display apparatus 1 according to an embodiment; FIGS. 2A and 2B are equivalent circuit diagrams of one pixel included in the display apparatus 1 according to an embodiment; FIG. 3 is a schematic plan view of a portion III of FIG. 1; and FIG. 4 is a schematic cross-sectional view of the display apparatus 1 according to an embodiment, and includes a schematic cross-section of the display apparatus 1 taken along line A-B of FIG. 3 and a schematic cross-section of the display apparatus 1 taken along line C-D of FIG. 1.

Referring to FIG. 1, the display apparatus 1 includes a display area DA disposed on a substrate 100. The display area DA includes pixels P electrically connected to a data line DL extending in a first direction and a scan line SL extending in a second direction intersecting the first direction. Each of the pixels P may be electrically connected to a driving voltage line PL extending in the first direction.

For example, each of the pixels P may emit red, green, blue, or white light, and may include an organic light-emitting diode. Each of the pixels P may further include devices such as a thin-film transistor and a capacitor.

A non-display area NDA is arranged outside the display area DA. For example, the non-display area NDA may surround the display area DA.

The non-display area NDA has no pixels P arranged therein and thus provides no images. In the non-display area NDA, a first power supply voltage line 10, and a second power supply voltage line 20 providing a different voltage from the first power supply voltage line 10 may be arranged.

The first power supply voltage line 10 may include a first main voltage line 11 and a first connection line 12 arranged on one side of the display area DA. For example, in case that the display area DA is rectangular, the first main voltage line 11 may be arranged to correspond to an edge of the display area DA. The first connection line 12 may extend from the first main voltage line 11 in a first direction from the display area DA to a terminal portion 30 disposed near an end of the substrate 100. The first connection line 12 may be electrically connected to a first terminal 31 of the terminal portion 30.

The second power supply voltage line 20 may include a second main voltage line 21 partially surrounding both ends of the first main voltage line 11 and the display area DA, and a second connection line 22 extending from the second main voltage line 21 in the first direction. For example, in case that the display area DA is rectangular, the second main voltage line 21 may extend along both ends of the first main voltage line 11 and remaining edges except for one edge of the display area DA that is adjacent to the first main voltage line 11. The second connection line 22 may extend parallel to the first connection line 12 in the first direction and may be electrically connected to a second terminal 32 of the terminal portion 30. The second power supply voltage line 20 may be bent to surround ends of the first power supply voltage line 10.

The terminal portion 30 is disposed on one end of the substrate 100 and may include a plurality of terminals, namely, the first terminal 31, the second terminal 32, and a third terminal 33. The terminal portion 30 may be exposed without being covered with an insulating layer and may be electrically connected to a flexible printed circuit board or a controller (not shown) such as a driver IC (integrated circuit) chip.

The controller may change image signals received from an external source into image data signals and may transmit the image data signals to the display area DA via the third terminal 33. The controller may transmit different voltages to the first power supply voltage line 10 and the second power supply voltage line 20 via the first terminal 31 and the second terminal 32, respectively.

The first power supply voltage line 10 may provide each of the pixels P with a first power supply voltage ELVDD (see FIGS. 2A and 2B), and the second power supply voltage line 20 may provide each of the pixels P with a second power supply voltage ELVSS (see FIGS. 2A and 2B).

For example, the first power supply voltage ELVDD may be provided to each of the pixels P via the driving voltage line PL electrically connected to the first power supply voltage line 10. The second power supply voltage ELVSS may be provided to a cathode of an organic light-emitting diode OLED (see FIGS. 2A and 2B) included in each of the pixels P. At this time, the second main voltage line 21 of the second power supply voltage line 20 may be electrically connected to the cathode of the organic light-emitting diode OLED in the non-display area NDA.

Although not shown in the drawings, a scan driver for providing a scan signal to the scan line SL of each of the pixels P and a data driver for providing a data signal to the data line DL of each of the pixels P, for example, may be arranged in the non-display area NDA.

In the non-display area NDA, a first dam 110 and a second dam 120 surrounding the display area DA may be spaced apart from each other. A third dam 130 surrounding the display area DA may be between the display area DA and the first dam 110. Although not shown in FIG. 1, a monitoring bank 140 (see FIG. 4) may be between the display area DA and the third dam 130.

When an organic encapsulation layer 420 (see FIG. 4) including an organic material such as a monomer and constituting a thin-film encapsulation layer 400 (see FIG. 4) is formed via an inkjet process, the first dam 110 and the second dam 120 may serve as a dam that blocks the organic material from flowing toward an edge of the substrate 100 to prevent an edge tail from being formed by the organic encapsulation layer 420 at an edge of the substrate 100.

Regardless of the inclusion of the first dam 110 and the second dam 120, the organic encapsulation layer 420 may extend to the edge of the substrate 100 beyond the first dam 110 and the second dam 120. For example, in case that the second dam 120 is disposed closer to the first dam 110 from an edge of the substrate 100 to reduce the size of a dead space or in case that the first dam 110 is disposed closer to the second dam 120 to expand the display area DA, a gap between the first dam 110 and the second dam 120 may be reduced, and thus the organic encapsulation layer 420 may extend beyond the second dam 120. An edge tail, which is formed by overflowed organic material, may serve as an entering path of external impurities that may cause a defect in the organic light-emitting diode OLED. Therefore, it has become more important to reduce and control the amount of overflowed organic material resulting from reduced dead space.

According to an embodiment, the third dam 130 between the display area DA and the first dam 110 may reduce a reflow velocity of the organic material to reduce the amount of the organic material that overflows to the first dam 110.

Referring to FIG. 2A, each of the pixels P may include a pixel circuit PC electrically connected to a scan line SL and a data line DL, and an organic light-emitting diode OLED electrically connected to the pixel circuit PC.

The pixel circuit PC may include a driving thin-film transistor T1, a switching thin-film transistor T2, and a storage capacitor Cst.

The switching thin-film transistor T2 transmits, to the driving thin-film transistor T1, a data signal Dm received via the data line DL according to a scan signal Sn received via the scan line SL.

The storage capacitor Cst is electrically connected to the switching thin-film transistor T2 and a driving voltage line PL, and stores a voltage corresponding to a difference between a voltage received from the switching thin-film transistor T2 and the first power supply voltage ELVDD (or referred to as a driving voltage) supplied to the driving voltage line PL.

The driving thin-film transistor T1 is electrically connected to the driving voltage line PL and the storage capacitor Cst and may control a driving current flowing from the driving voltage line PL to the organic light-emitting diode OLED, in accordance with a voltage value stored in the storage capacitor Cst. The organic light-emitting diode OLED may emit light having a certain luminance in response to the driving current.

Although FIG. 2A illustrates the pixel circuit PC including two thin-film transistors and one storage capacitor, embodiments are not limited thereto.

Referring to FIG. 2B, the pixel circuit PC may include a driving thin-film transistor T1, a switching thin-film transistor T2, a compensating thin-film transistor T3, a first initializing thin-film transistor T4, a first light-emission control thin-film transistor T5, a second light-emission control thin-film transistor T6, and a second initializing thin-film transistor T7.

Although FIG. 2B illustrates the pixel circuit PC including signal lines, namely, a first scan line SLn, a second scan line SLn-1, a light-emission control line EL, and a data line DL, an initializing voltage line VL, and a driving voltage line PL, embodiments are not limited thereto. In another embodiment, at least one of the signal lines, namely, the first scan line SLn, the second scan line SLn-1, the light-emission control line EL, and the data line DL, or/and the initializing voltage line VL may be shared with neighboring pixel circuits.

A drain electrode of the driving thin-film transistor T1 may be electrically connected to the organic light-emitting diode OLED via the second light-emission control thin-film transistor T6. The driving thin-film transistor T1 receives the data signal Dm according to a switching operation of the switching thin-film transistor T2 and supplies a driving current to the organic light-emitting diode OLED.

A gate electrode of the switching thin-film transistor T2 is electrically connected to the first scan line SLn, and a source electrode thereof is electrically connected to the data line DL. A drain electrode of the switching thin-film transistor T2 may be electrically connected to a source electrode of the driving thin-film transistor T1 and may also be electrically connected to the driving voltage line PL via the first light-emission control thin-film transistor T5.

The switching thin-film transistor T2 is turned on according to the scan signal Sn received via the first scan line SLn and performs a switching operation of transmitting the data signal Dm received from the data line DL to the source electrode of the driving thin-film transistor T1.

A gate electrode of the compensating thin-film transistor T3 may be electrically connected to the first scan line SLn. A source electrode of the compensating thin-film transistor T3 may be electrically connected to the drain electrode of the driving thin-film transistor T1 and at the same time may be electrically connected to a pixel electrode of the organic light-emitting diode OLED via the second light-emission control thin-film transistor T6. A drain electrode of the compensating thin-film transistor T3 may be electrically connected to one electrode of the storage capacitor Cst, a source electrode of the first initializing thin-film transistor T4, and a gate electrode of the driving thin-film transistor T1. The compensating thin-film transistor T3 is turned on according to a first scan signal Sn received via the first scan line SLn and electrically connects the gate electrode to the drain electrode of the driving thin-film transistor T1 to each other to diode-connect the driving thin-film transistor T1.

A gate electrode of the first initializing thin-film transistor T4 may be electrically connected to the second scan line SLn-1 (previous scan line). A drain electrode of the first initializing thin-film transistor T4 may be electrically connected to the initializing voltage line VL. A source electrode of the first initializing thin-film transistor T4 may be electrically connected to the one electrode of the storage capacitor Cst, the drain electrode of the compensating thin-film transistor T3, and the gate electrode of the driving thin-film transistor T1. The first initializing thin-film transistor T4 may be turned on according to a second scan signal Sn-1 received via the second scan line SLn-1 and may transmit an initializing voltage VINT to the gate electrode of the driving thin-film transistor T1 to initialize a voltage of the gate electrode of the driving thin-film transistor T1.

A gate electrode of the first light-emission control thin-film transistor T5 may be electrically connected to the light-emission control line EL. A source electrode of the first light-emission control thin-film transistor T5 may be electrically connected to the driving voltage line PL. A drain electrode of the first light-emission control thin-film transistor T5 may be electrically connected to the source electrode of the driving thin-film transistor T1 and the drain electrode of the switching thin-film transistor T2.

A gate electrode of the second light-emission control thin-film transistor T6 may be electrically connected to the light-emission control line EL. A source electrode of the second light-emission control thin-film transistor T6 may be electrically connected to the drain electrode of the driving thin-film transistor T1 and the source electrode of the compensating thin-film transistor T3. A drain electrode of the second light-emission control thin-film transistor T6 may be electrically connected to the pixel electrode of the organic light-emitting diode OLED. The first light-emission control thin-film transistor T5 and the second light-emission control thin-film transistor T6 may be simultaneously turned on according to a light-emission control signal En received via the light-emission control line EL, and thus the first driving voltage ELVDD is transmitted to the organic light-emitting diode OLED and the driving current flows into the organic light-emitting diode OLED.

A gate electrode of the second initializing thin-film transistor T7 may be electrically connected to the second scan line SLn-1. A source electrode of the second initializing thin-film transistor T7 may be electrically connected to the pixel electrode of the organic light-emitting diode OLED. A drain electrode of the second initializing thin-film transistor T7 may be electrically connected to the initializing voltage line VL. The second initializing thin-film transistor T7 may be turned on according to a second scan signal Sn-1 received via the second scan line SLn-1 and may initialize the pixel electrode of the organic light-emitting diode OLED.

Although the first initializing thin-film transistor T4 and the second initializing thin-film transistor T7 are electrically connected to the second scan line SLn-1 in FIG. 2B, the disclosure is not limited thereto. According to another embodiment, the first initializing thin-film transistor T4 may be electrically connected to the second scan line SLn-1 as a previous scan line and may operate according to the second scan signal SLn-1, and the second initializing thin-film transistor T7 may be electrically connected to a separate signal line (for example, a subsequent scan line) and operate according to a signal transmitted to the separate signal line.

Another electrode of the storage capacitor Cst may be electrically connected to the driving voltage line PL. The one electrode of the storage capacitor Cst may be electrically connected to the gate electrode of the driving thin-film transistor T1, the drain electrode of the compensating thin-film transistor T3, and the source electrode of the first initializing thin-film transistor T4.

An opposite electrode (for example, a cathode) of the organic light-emitting diode OLED receives the second power supply voltage ELVSS (or common power supply voltage). The organic light-emitting diode OLED receives the driving current from the driving thin-film transistor T1 and emits light.

The pixel circuit PC is not limited to the number of thin-film transistors, the number of storage capacitors, and the circuit designs described above with reference to FIGS. 2A and 2B. The number of thin-film transistors, the number of storage capacitors, and a circuit design may vary.

Referring to FIG. 3, pixels P are arranged in the portion III of FIG. 1. The pixels P are surrounded by an organic insulating layer 113, and spacers 115 are disposed on the organic insulating layer 113. Although the pixels P have rectangular shapes having the same size in FIG. 3, this is merely an example, and various modifications may be made to the sizes, shapes, and arrangements of the pixels P.

The spacers 115 may be between some of the pixels P. In a deposition process of forming an intermediate layer 320 (see FIG. 4) including an emission layer, the spacers 115 may maintain a distance between a mask (not shown) and the substrate 100 to prevent the intermediate layer 320 from being chopped or torn by the mask during the deposition process.

The spacers 115 and the organic insulating layer 113 may include the same material or different materials. In case that a halftone mask is used, the spacers 115 may be formed simultaneously with the organic insulating layer 113 to have different heights from the organic insulating layer 113 by using the same material as the organic insulating layer 113.

Referring to FIG. 4, in A-B region, which is a portion of the cross-section of the display area DA, a buffer layer 101 is arranged on the substrate 100, and a driving thin-film transistor T1 is arranged on the buffer layer 101. FIG. 4 omits an arrangement of a switching thin-film transistor T2 and a storage capacitor Cst.

The substrate 100 may include any of various materials, for example, glass, metal, or plastic. For example, the substrate 100 may be a flexible substrate including a polymer resin, such as polyethersulphone (PES), polyacrylate (PAR), polyetherimide (PEI), polyethyelenen napthalate (PEN), polyethyeleneterepthalate (PET), polyphenylene sulfide (PPS), polyallylate, polyimide (PI), polycarbonate (PC), or cellulose acetate propionate (CAP).

The buffer layer 101 disposed on the substrate 100 may include silicon oxide ($SiO_x$) and/or silicon nitride ($SiN_x$) to prevent permeation of impurities.

The driving thin-film transistor T1 may include a driving semiconductor layer A1, a driving gate electrode G1, a driving source electrode S1, and a driving drain electrode D1.

A gate insulating layer 103 may be between the driving semiconductor layer A1 and the driving gate electrode G1, and an interlayer insulating layer 107 may be between the driving gate electrode G1 and the driving source and drain electrodes S1 and D1.

The driving semiconductor layer A1 may include amorphous silicon or polycrystalline silicon. According to another embodiment, the driving semiconductor layer A1 may be an oxide semiconductor including a material selected from the group consisting of indium (In), gallium (Ga), tin (Sn), zirconium (Zr), vanadium (V), hafnium (Hf), cadmium (Cd), germanium (Ge), chromium (Cr), titanium (Ti), and zinc (Zn).

The driving semiconductor layer A1 may include a driving channel region overlapped by the driving gate electrode G1 and undoped with impurities, and a driving source region and a driving drain region, which are doped with impurities and are disposed respectively on both sides of the driving channel region.

The gate insulating layer 103 may be a single layer or multi-layer including an inorganic insulating material such as silicon oxide ($SiO_x$), silicon nitride ($SiN_x$), or silicon oxynitride (SiON).

The driving gate electrode G1 may be a single-layered or multi-layered electrode including molybdenum (Mo), aluminum (Al), copper (Cu), or titanium (Ti).

The interlayer insulating layer 107 may be a single layer or multi-layer including an inorganic insulating material such as silicon oxynitride (SiON), silicon oxide ($SiO_x$), or silicon nitride ($SiN_x$).

The driving source electrode S1 and the driving drain electrode D1 may be disposed on the interlayer insulating layer 107 and may be connected to the driving source region and the driving drain region of the driving semiconductor layer A1, respectively, via contact holes that penetrate through the interlayer insulating layer 107.

A first planarization layer 109 may be disposed on the interlayer insulating layer 107 to cover or overlap the driving source electrode S1 and the driving drain electrode D1, and a second planarization layer 111 may be disposed on the first planarization layer 109.

Each of the first planarization layer 109 and the second planarization layer 111 may include an organic insulating material and may be a single layer or a multi-layer. For example, the organic insulating material may include an imide-based polymer, a commercial polymer (such as polymethyl methacrylate (PMMA) or polystyrene (PS)), a polymer derivative having a phenol-based group, an acryl-based polymer, an aryl ether-based polymer, an amide-based polymer, a fluorine-based polymer, a p-xylene-based polymer, or a vinyl alcohol-based polymer.

Each of the first planarization layer 109 and the second planarization layer 111 may include an inorganic insulating material. Examples of the inorganic insulating material may include silicon oxynitride (SiON), silicon oxide ($SiO_x$), and silicon nitride ($SiN_x$).

An organic light-emitting diode OLED may be disposed on the second planarization layer 111 and may include a pixel electrode 310, an opposite electrode 330, and an intermediate layer 320 that is disposed between the pixel electrode 310 and the opposite electrode 330 and includes an emission layer.

The pixel electrode 310 may be electrically connected to a connection line CL disposed on the first planarization layer 109 via a fifth via hole 111h5 provided in the second planarization layer 111, and the connection line CL may be electrically connected to the driving drain electrode D1 of the driving thin-film transistor T1 via a first via hole 109h1 provided in the first planarization layer 109.

The pixel electrode 310 may be a transparent electrode or a reflective electrode.

In case that the pixel electrode 310 is implemented as a transparent electrode, the pixel electrode 310 may include a transparent conductive layer. The transparent conductive layer may include at least one material selected from the group consisting of indium tin oxide, indium zinc oxide, zinc oxide, indium oxide, indium gallium oxide, and aluminum zinc oxide. The pixel electrode 310 may further include a semi-transparent layer for improving luminescent efficiency, in addition to the transparent conductive layer. The semi-transparent layer may include at least one material selected from among silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), and ytterbium (Yb) as a thin film of several to several tens of micrometers (μm).

In case that the pixel electrode 310 is implemented as a reflective electrode, the pixel electrode 310 may include a reflective layer including at least one material selected from the group consisting of Ag, Mg, Al, Pt, Pd, Au, Ni, Nd, Ir, and Cr. The pixel electrode 310 may further include a transparent conductive layer arranged above and/or below the reflective layer. The transparent conductive layer may include at least one material selected from the group consisting of indium tin oxide, indium zinc oxide, zinc oxide, indium oxide, indium gallium oxide, and aluminum zinc oxide.

The organic insulating layer 113 may be disposed on the pixel electrode 310.

The organic insulating layer 113 in the display area DA may define a pixel P by having an opening that exposes the pixel electrode 310. The organic insulating layer 113 in the display area DA may prevent generation of an arc at an end of the pixel electrode 310 by increasing a distance between the edge of the pixel electrode 310 and the opposite electrode 330. The organic insulating layer 113 may include, for example, an organic material such as polyimide or hexamethyldisiloxane (HMDSO).

The intermediate layer 320 may include a low-molecular weight or high-molecular weight material.

In case that the intermediate layer 320 includes a low-molecular weight material, the intermediate layer 320 may be a single- or multi-layered stack structure including at least one of a hole injection layer, a hole transport layer, an emission layer, an electron transport layer, and an electron injection layer. The intermediate layer 320 may include various organic materials including copper phthalocyanine (CuPc), N,N'-Di(naphthalene-1-yl)-N, N'-diphenyl-benzidine (NPB), and tris-8-hydroxyquinoline aluminum (Alq3). The intermediate layer 320 may be formed using various methods such as vacuum deposition.

In case that the intermediate layer 320 includes a high-molecular weight material, the intermediate layer 320 may include a hole transport layer and an emission layer. The hole transport layer may include poly(ethylenedioxythiophene) (PEDOT), and the emission layer may include a high-molecular weight material such as a polyphenylene vinylene (PPV)-based material or a polyfluorene-based material. The intermediate layer 320 may be formed using various methods such as screen printing, inkjet printing, and laser induced thermal imaging.

The intermediate layer 320 may be a common layer commonly disposed on the pixel electrodes 310 or may be a patterned layer that separates the pixel electrodes 310 from one another.

The opposite electrode 330 may be on the intermediate layer 330 and may cover the entire display area DA.

The opposite electrode 330 may be a transparent electrode or a reflective electrode.

In case that the opposite electrode 330 is a transparent electrode, the opposite electrode 330 may include at least one material selected among Ag, Al, Mg, Li, Ca, Cu, LiF/Ca, LiF/Al, MgAg, and CaAg, and may be a thin film having a thickness in a range of about 1 to about 100 micrometers (μm).

In case that the opposite electrode 330 is a reflective electrode, the opposite electrode 330 may include at least one material selected among Ag, Al, Mg, Li, Ca, Cu, LiF/Ca, LiF/Al, MgAg, and CaAg. The configuration of the opposite electrode 330 and the material used to form the opposite electrode 330 are not limited to those described above, and various modifications may be made to the opposite electrode 330.

A spacer 115 may be disposed on the organic insulating layer 113. The spacer 115 may protrude in a direction from the organic insulating layer 113 to the thin-film encapsulation layer 400 and may maintain a distance between a mask and the substrate 100 in a deposition process of forming the intermediate layer 320 including an emission layer by using the mask, to prevent the intermediate layer 320 from being chopped or torn by the mask during the deposition process.

The spacer 115 may include an organic material, for example, polyimide or HMDSO. The spacer 115 may be arranged in at least one of the first, second, and third dams 110, 120, and 130, which will be described below, to prevent permeation of moisture and form height differences between dams.

Because the organic light-emitting diode OLED may be easily damaged by external moisture, external oxygen, or the like, the organic light-emitting diode OLED may be covered (or overlapped) and protected by the thin-film encapsulation layer 400.

The thin-film encapsulation layer 400 may cover or overlap the display area DA and extend beyond the display area DA. The thin-film encapsulation layer 400 includes at least one organic encapsulation layer and at least one inorganic encapsulation layer. According to an embodiment, the thin-film encapsulation layer 400 may include a first inorganic encapsulation layer 410, an organic encapsulation layer 420, and a second inorganic encapsulation layer 430.

The first inorganic encapsulation layer 410 may cover the entire opposite electrode 330 and may include silicon oxide, silicon nitride, and/or silicon oxynitride.

Optionally, other layers, such as a capping layer (not shown), may be disposed between the first inorganic encapsulation layer 410 and the opposite electrode 330. For example, the capping layer (not shown) may include one or more organic materials or inorganic materials selected from among silicon oxide ($SiO_2$), silicon nitride ($SiN_x$), zinc oxide ($ZnO_2$), titanium oxide ($TiO_2$), zirconium oxide ($ZrO_2$), indium tin oxide (ITO), indium zinc oxide (IZO), Alq3, CuPc, CBP, a-NPB, and $ZiO_2$, in order to improve luminous efficiency. In another embodiment, the capping layer (not shown) may occur plasmon resonance with the light generated by the organic light-emitting diode OLED. For example, the capping layer (not shown) may include nanoparticles. The capping layer (not shown) may prevent the organic light-emitting diode OLED from being damaged by heat, plasma, or the like generated during chemical vapor deposition or sputtering for forming the thin-film encapsulation layer 400. For example, the capping layer (not shown) may include an epoxy-based material including at least one of bisphenol-type epoxy resin, epoxidation butadiene resin, fluorine-type epoxy resin, and novolac epoxy resin.

Optionally, a layer (not shown) including LiF or the like may be disposed between the first inorganic encapsulation layer 410 and the capping layer (not shown).

Because the first inorganic encapsulation layer 410 is formed along structures below the first inorganic encapsulation layer 410, the upper surface thereof may not be flat. The organic encapsulation layer 420 covers and planarizes the first inorganic encapsulation layer 410. The organic encapsulation layer 420 may have an approximately flat upper surface at a portion corresponding to the display area DA.

For example, the organic encapsulation layer 420 may include polyethylene terephthalate, polyethylene naphthalate, polycarbonate, polyimide, polyethylene sulfonate, polyoxymethylene, polyarylate, hexamethyldisiloxane, acryl-based resin (e.g., polymethyl methacrylate or polyacryl acid), or any combination thereof.

The second inorganic encapsulation layer 430 may cover the organic encapsulation layer 420 and may include silicon oxide, silicon nitride, and/or silicon oxynitride. The second inorganic encapsulation layer 430 may directly contact an upper surface of the first inorganic encapsulation layer 410 at an edge region of the display apparatus 1, preventing the organic encapsulation layer 420 from being exposed to the outside of the display apparatus 1.

Although a detailed shape of a touch electrode (not shown) is not illustrated in FIG. 4, a touch screen layer 700 including a touch electrode of various patterns may be arranged on the second inorganic encapsulation layer 430. The touch electrode may include a transparent electrode material that transmits the light emitted from the organic light-emitting diode OLED disposed below the touch screen layer 700.

Although not shown in FIG. 4, a touch buffer layer (not shown) may be further included between the thin-film encapsulation layer 400 and the touch screen layer 700. The touch buffer layer may prevent damage to the thin-film encapsulation layer 400 and may block an interference signal that may be generated while the touch screen layer 700 is being driven. For example, the touch buffer layer may include an inorganic material (such as silicon oxide, silicon nitride, silicon oxynitride, aluminum oxide, aluminum nitride, titanium oxide, or titanium nitride) or an organic material (such as polyimide, polyester, or acryl), and may be stacks including some of the aforementioned materials.

Because the touch buffer layer and/or the touch screen layer 700 may be directly formed on the thin-film encapsulation layer 400 via deposition or the like, no special adhesive layers are required on the thin-film encapsulation layer 400. Accordingly, the display apparatus 1 may have a reduced thickness.

Outside the touch screen layer 700, a touch connection line 710 for transmitting a signal sensed by the touch electrode may extend to the non-display area NDA.

In C-D region of FIG. 4, the buffer layer 101, the gate insulating layer 103, the interlayer insulating layer 107, and the first planarization layer 109 extending from the display area DA may be arranged.

Spider lines SPL may be arranged between the gate insulating layer 103 and the interlayer insulating layer 107, a first conductive layer 10a and a third conductive layer 20a may be arranged on the interlayer insulating layer 107, and a second conductive layer 10b and a fourth conductive layer 20b may be arranged on the first planarization layer 109.

The first conductive layer 10a and the second conductive layer 10b may be electrically connected to each other via a second via hole 109h2 provided in the first planarization layer 109 and may form (or constitute) the first power supply voltage line 10 providing each of the pixels P with the first power supply voltage ELVDD (see FIGS. 2A and 2B). The first power supply voltage line 10 may be implemented as a two-layered conductive layer to have a reduced width, thereby reducing a dead space.

The third conductive layer 20a and the fourth conductive layer 20b may be electrically connected via a third via hole 109h3 and a fourth via hole 109h4 provided in the first planarization layer 109 and may form (or constitute) the second power supply voltage line 20 providing each of the pixels P with the second power supply voltage ELVSS (see FIGS. 2A and 2B). The second power supply voltage line 20 may be implemented as a two-layered conductive layer to have a reduced width, thereby reducing a dead space.

The first conductive layer 10a, the third conductive layer 20a, and the connection line CL may include a same material; and the second conductive layer 10b, the fourth conductive layer 20b, the source electrode S1, and the drain electrode D1 may include a same material.

The second planarization layer 111 is disposed on the second conductive layer 10b of the first power supply voltage line 10, and the organic insulating layer 113 is disposed on the second planarization layer 111. The opposite electrode 330 provided in the display area DA may extend and may be arranged on the organic insulating layer 113.

The monitoring bank 140, the third dam 130, the first dam 110, and the second dam 120 may be sequentially arranged on the fourth conductive layer 20b of the second power supply voltage line 20, in a direction from the display area DA to an end of the substrate 100.

The monitoring bank 140 may include a first layer 111d and a second layer 113d. The first layer and the second planarization layer 111 may include a same material, and the second layer 113d and the organic insulating layer 113 may include a same material.

The third dam 130 may include a first layer 111c and a second layer 113c. The first layer 111c and the second planarization layer 111 may include a same material, and the second layer 113c and the organic insulating layer 113 may include a same material.

The first dam 110 may include a first layer 111a and a second layer 113a. The first layer 111a and the second planarization layer 111 may include a same material, and the second layer 113a and the organic insulating layer 113 may include a same material.

The second dam 120 may include a first layer 111b, a second layer 113b, and a third layer 115b. The first layer 111b and the second planarization layer 111 may include a same material, the second layer 113b and the organic insulating layer 113 may include a same material, and the third layer 115b and the spacer 115 may include a same material.

The second dam 120 may have a greater height than the first dam 110 and the third dam 130 to prevent the organic encapsulation layer 420 from extending beyond the second dam 120 and making an edge tail, and a distance between a mask and the substrate 100 may be maintained in a deposition process of forming the intermediate layer 320 by using the mask to prevent the intermediate layer 320 from being chopped or torn by the mask during the deposition process.

The first layer 111b of the second dam 120 may clad an end of the fourth conductive layer 20b to prevent the fourth conductive layer 20b from being damaged while the second planarization layer 111 is wet-etched.

In case that the organic encapsulation layer 420 is formed using an inkjet method and an inkjet discharge location of an organic material is biased toward an end of the substrate 100, the organic material may overflow to the outside of the second dam 120. On the other hand, in case that the inkjet discharge location of the organic material is biased toward the display area DA, the first and second inorganic encapsulation layers 410 and 430 may be cracked due to the lack of an organic material filled in the non-display area NDA. Accordingly, there is a need to monitor whether the organic material is accurately discharged to a target location and is safely disposed on the target location and to adjust a discharge location of an organic material.

In an embodiment, to sufficiently fill a space below the touch connection line 710 with the organic encapsulation layer 420, the target location of the organic material is set to be between an end E0 of the touch connection line 710 and the third dam 120, and the monitoring bank 140 is provided between the end E0 of the touch connection line 710 and the third dam 120 to monitor the disposing location of the organic material.

Because the monitoring bank 140 is formed (or constituted) by the first layer 111d and the second layer 113d, wherein the first layer 111d and the second planarization layer 111 include a same material, the first layer 111d has a thickness D4, and the second layer 113d and the organic insulating layer 113 include a same material, a height H4 of the monitoring bank 140 is greater than a height H0 of the organic insulating layer 113 between the end E0 of the touch connection line 710 and the monitoring bank 140. In other words, a height difference is formed between the upper surface of the monitoring bank 140 and a peripheral region around the monitoring bank 140.

For example, in case that there is no organic material discharged via an inkjet process near the monitoring bank 140, the boundary of the monitoring bank 140 may be clearly observed because of the height difference between the monitoring bank 140 and the peripheral region; however, in case that the organic material discharged via the inkjet process is disposed near the monitoring bank 140, the boundary of the monitoring bank 140 may be slightly and vaguely observed. In case that the organic material covers or overlaps the monitoring bank 140, the boundary of the monitoring bank 140 may be more vaguely observed, and thus the disposing location of the organic material discharged via the inkjet process near the monitoring bank 140 may be monitored (or checked).

The height H4 of the monitoring bank 140 may be less than heights H1, H2, and H3 of the first, second, and third dams 110, 120, and 130, so as to let the first, second, and third dams 110, 120, and 130 block a flow of the organic encapsulation layer 420.

A thickness D4 of the first layer 111d included in the monitoring bank 140 may be less than a thickness D1 of the first layer 111a included in the first dam 110. For example, by forming the second planarization layer 111 by using a halftone mask, the first layer 111d of the monitoring bank 140 and the first layer 111a of the first dam 110 may have different thicknesses.

Although FIG. 4 does not illustrate a thickness of the first layer 111c of the third dam 130 and a thickness of the first layer 111b of the second dam 120, the first layer 111c of the third dam 130 and the first layer 111b of the second dam 120 may have the thicknesses equal to the thickness D4 of the first layer 111a of the first dam 110.

The display apparatus 1 according to an embodiment may prevent voltage drop by providing the second power supply voltage line 20, a width of which is greater than that of the first power supply voltage line 10.

The fourth conductive layer 20b may be a single layer or multi-layer including at least one of aluminum (Al), copper (Cu), titanium (Ti), and an alloy thereof. For example, the fourth conductive layer 20b may be a stack of a first layer including titanium (Ti), a second layer including aluminum (Al), and a third layer including titanium (Ti).

Although the display apparatus 1 according to an embodiment includes the first, second, and third dams 110, 120, and 130 and the monitoring bank 140, all of which are arranged on the upper surface of the fourth conductive layer 20b, embodiments are not limited thereto.

Figure 5:
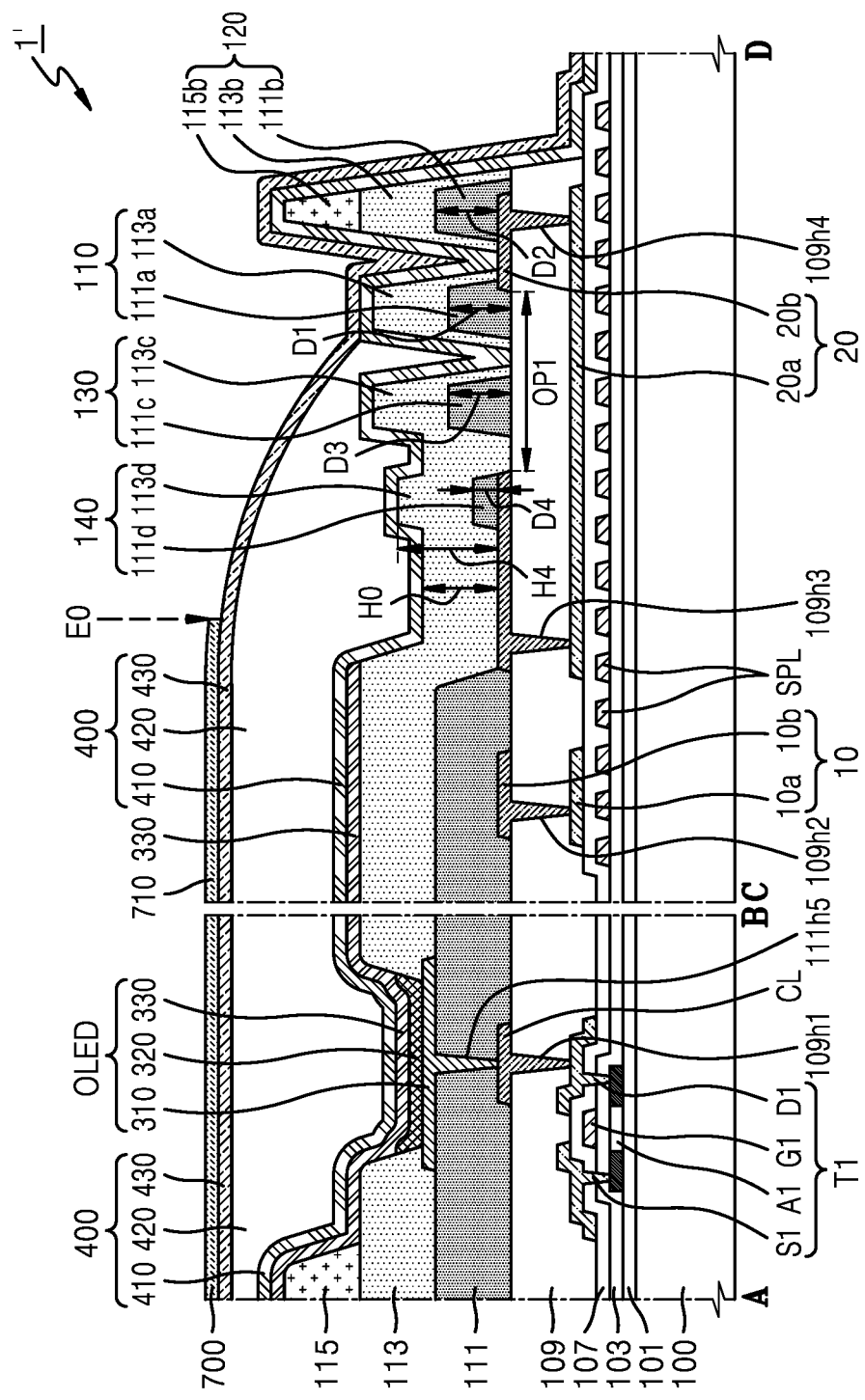
FIG. 5 is a schematic cross-sectional view of a display apparatus according to an embodiment, and illustrates a cross-section of the display apparatus taken along line A-B of FIG. 3 and a cross-section of the display apparatus taken along line C-D of FIG. 1.

FIG. 5 is a schematic cross-sectional view of a display apparatus 1' according to an embodiment and includes a schematic cross-section of the display apparatus 1' taken along line A-B of FIG. 3 and a schematic cross-section of the display apparatus 1' taken along line C-D of FIG. 1.

The display apparatus 1' of FIG. 5 is different from the display apparatus 1 of FIG. 4 in terms of a structure of the fourth conductive layer 20b included in the second power supply voltage line 20.

As the display apparatus 1' of FIG. 5, at least one first opening OP1 may be provided in the upper surface of the fourth conductive layer 20b, and at least one of the monitoring bank 140 and the first, second, and third dams 110, 120, and 130 may directly contact the upper surface of the first planarization layer 109 instead of the upper surface of the fourth conductive layer 20b.

Because the first opening OP1 provided in the fourth conductive layer 20b function as a discharge passage of an organic gas that is generated by the first planarization layer 109, the first opening OP1 may prevent the display apparatus 1' from being degraded due to outgassing of the organic gas.

Similar to the embodiment of FIG. 4, the height H4 of the monitoring bank 140 in the embodiment of FIG. 5 may be greater than the height H0 of the organic insulating layer 113 between the end E0 of the touch connection line 710 and the monitoring bank 140, and thus a height difference may be provided between the upper surface of the monitoring bank 140 and the peripheral region around the monitoring bank 140.

Similar to the embodiment of FIG. 4, the thickness D4 of the first layer 111d included in the monitoring bank 140 may be less than the thickness D1 of the first layer 111a included in the first dam 110. The thickness D4 of the first layer 111d included in the monitoring bank 140 may be less than a thickness D3 of the first layer 111c included in the third dam 130 and a thickness D2 of the first layer 111b included in the second dam 120.

FIGS. 6A through 6D are schematic magnified plan views of a region A2 of FIG. 1 and illustrate various embodiments of the shapes of a monitoring bank and first through third dams according to an embodiment.

Figure 6A:
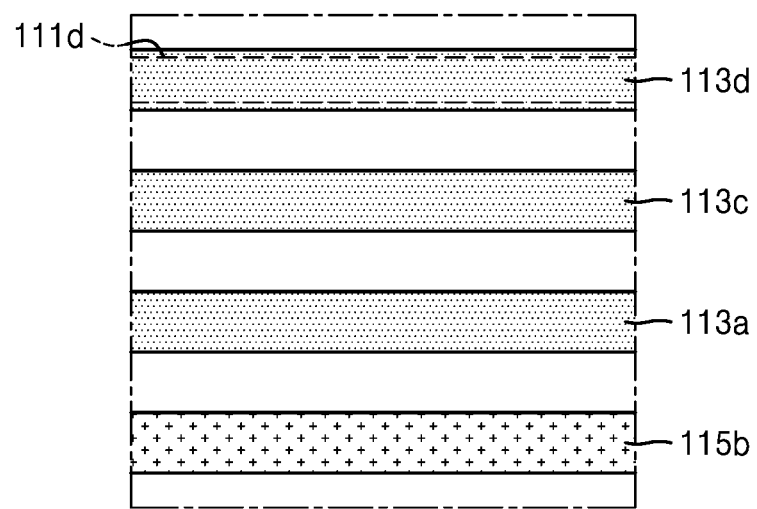
FIGS. 6A through 6D are schematic magnified plan views of a region A2 of FIG. 1.

Referring to FIG. 6A, the second layer 113c of the third dam 130, the second layer 113a of the first dam 110, and the third layer 115b of the second dam 120, which respectively correspond to topmost layers of the third, first, and second dams 130, 110, and 120, are arranged in stripe shapes, and the first layer 111d and the second layer 113d of the monitoring bank 140 are arranged in stripe shapes.

Figure 6B:
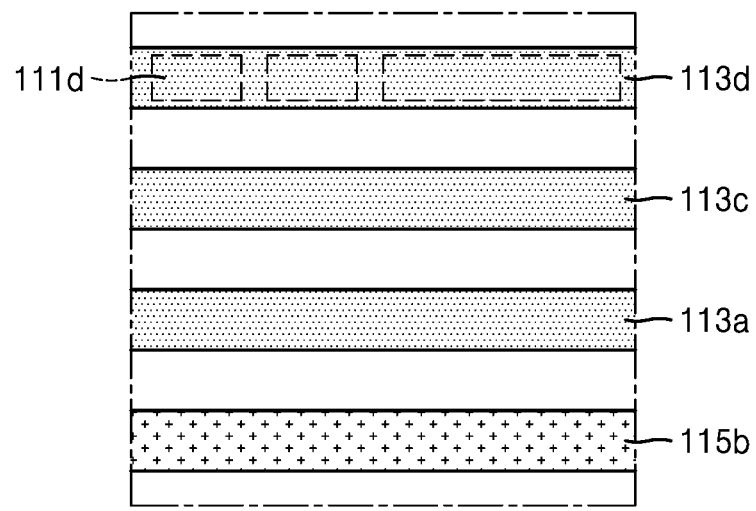

Referring to FIG. 6B, the second layer 113c of the third dam 130, the second layer 113a of the first dam 110, and the third layer 115b of the second dam 120, which respectively correspond to topmost layers of the third, first, and second dams 130, 110, and 120, are arranged in stripe shapes; the first layer 111d of the monitoring bank 140 is arranged in an array of islands separated from each other; and the second layer 113d of the monitoring bank 140 is arranged in a stripe shape.

Figure 6C:
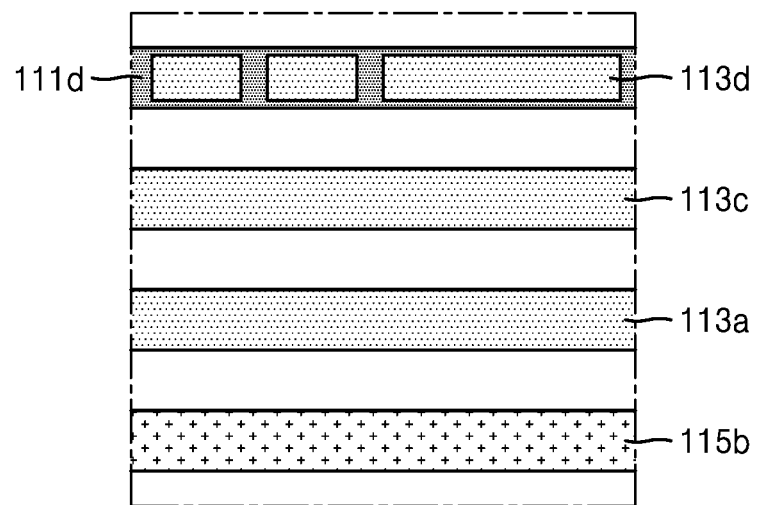

Referring to FIG. 6C, the second layer 113c of the third dam 130, the second layer 113a of the first dam 110, and the third layer 115b of the second dam 120, which respectively correspond to topmost layers of the third, first, and second dams 130, 110, and 120, are arranged in stripe shapes; the first layer 111d of the monitoring bank 140 is arranged in a stripe shape; and the second layer 113d of the monitoring bank 140 is arranged in an array of islands separated from each other.

Figure 6D:
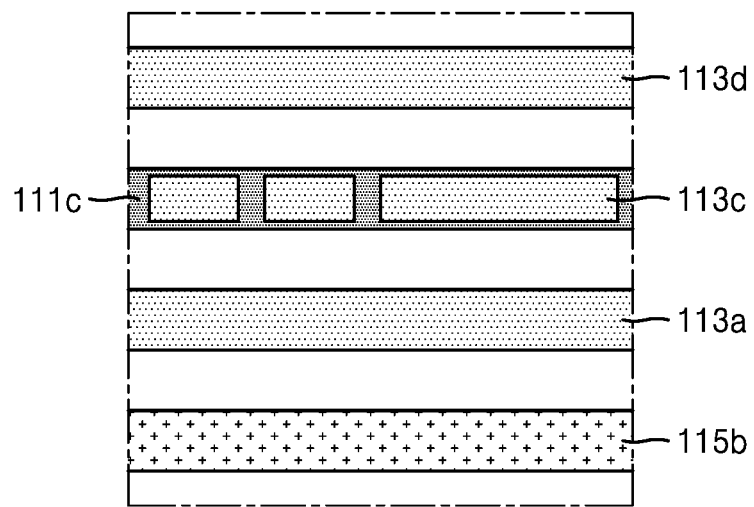

Referring to FIG. 6D, the second layer 113a of the first dam 110 and the third layer 115b of the second dam 120, which respectively correspond to topmost layers of the first and second dams 110 and 120, are arranged in stripe shapes; the first layer 111c of the third dam 130 is arranged in a stripe shape; the second layer 113c of the third dam 130 is arranged in an array of islands separated from each other; and as shown in FIG. 6A, the second layer 113d, which is the topmost layer of the monitoring bank 140, is arranged in a stripe shape.

Figure 7:
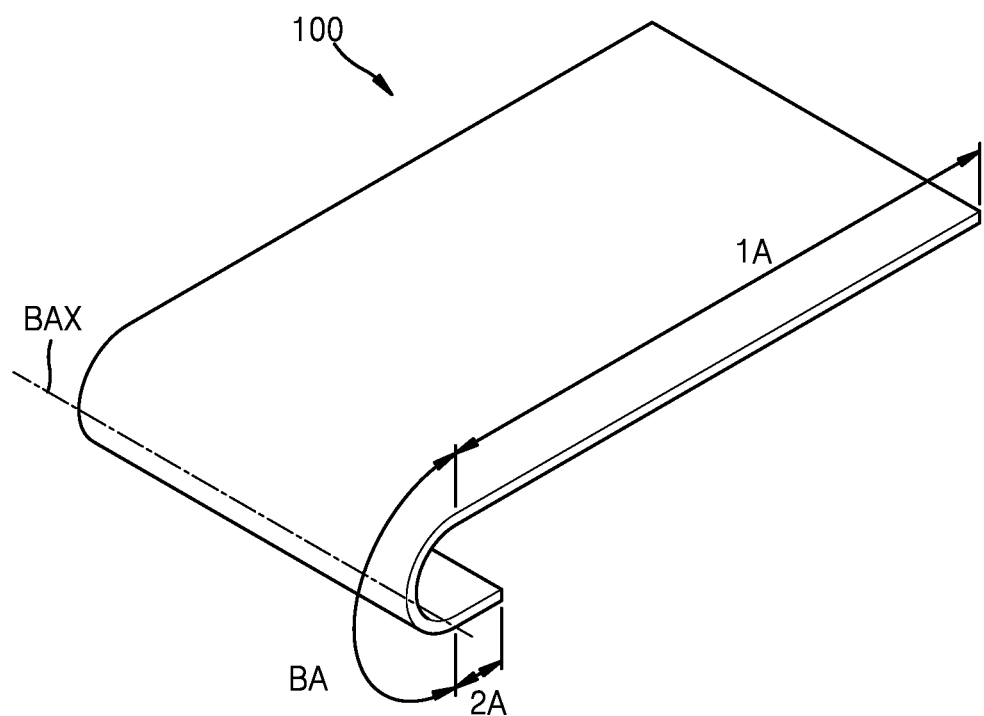
FIG. 7 is a schematic perspective view of a display apparatus according to an embodiment.
Figure 8:
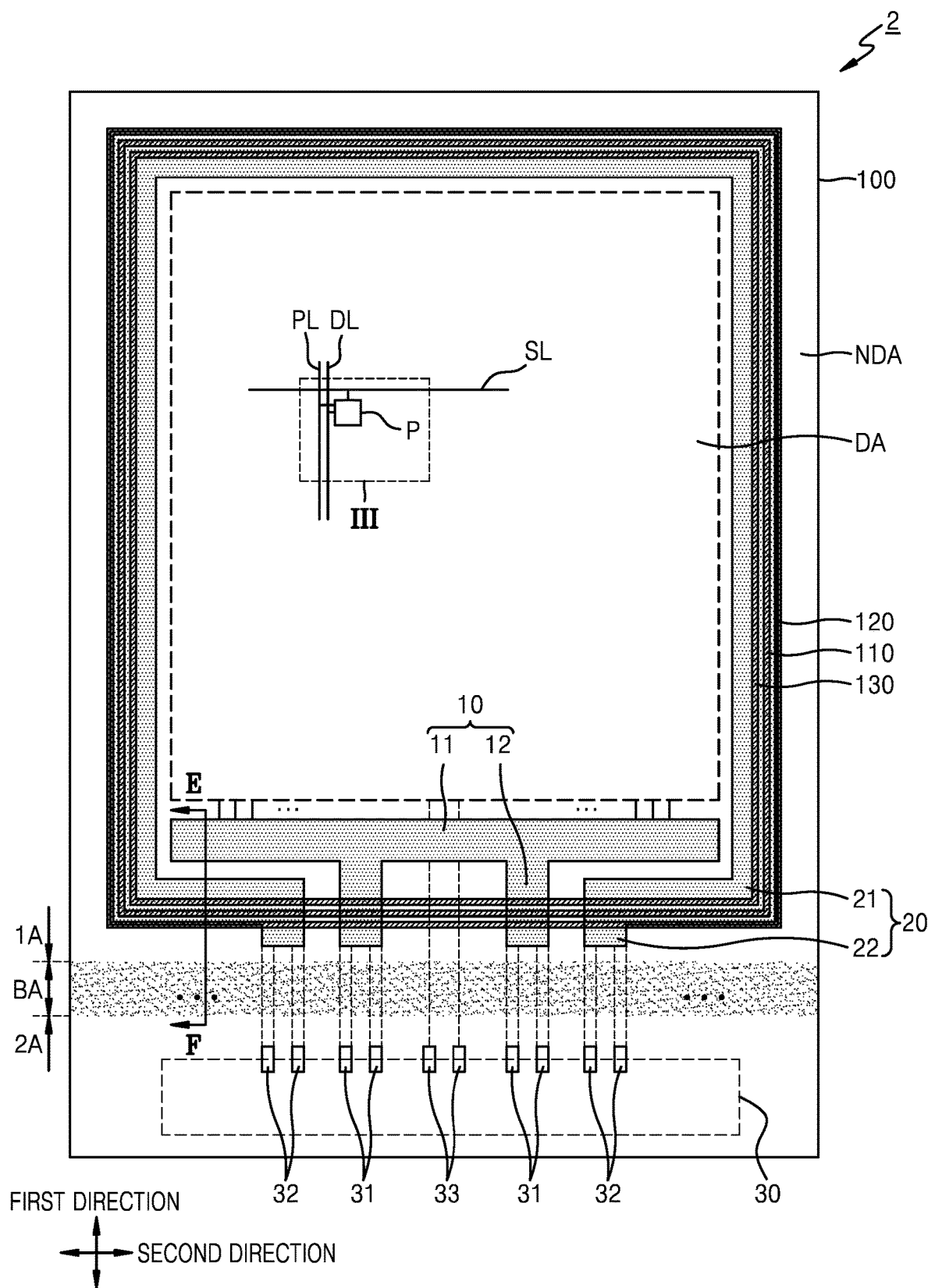
FIG. 8 is a schematic plan view of a display apparatus according to an embodiment.
Figure 9:
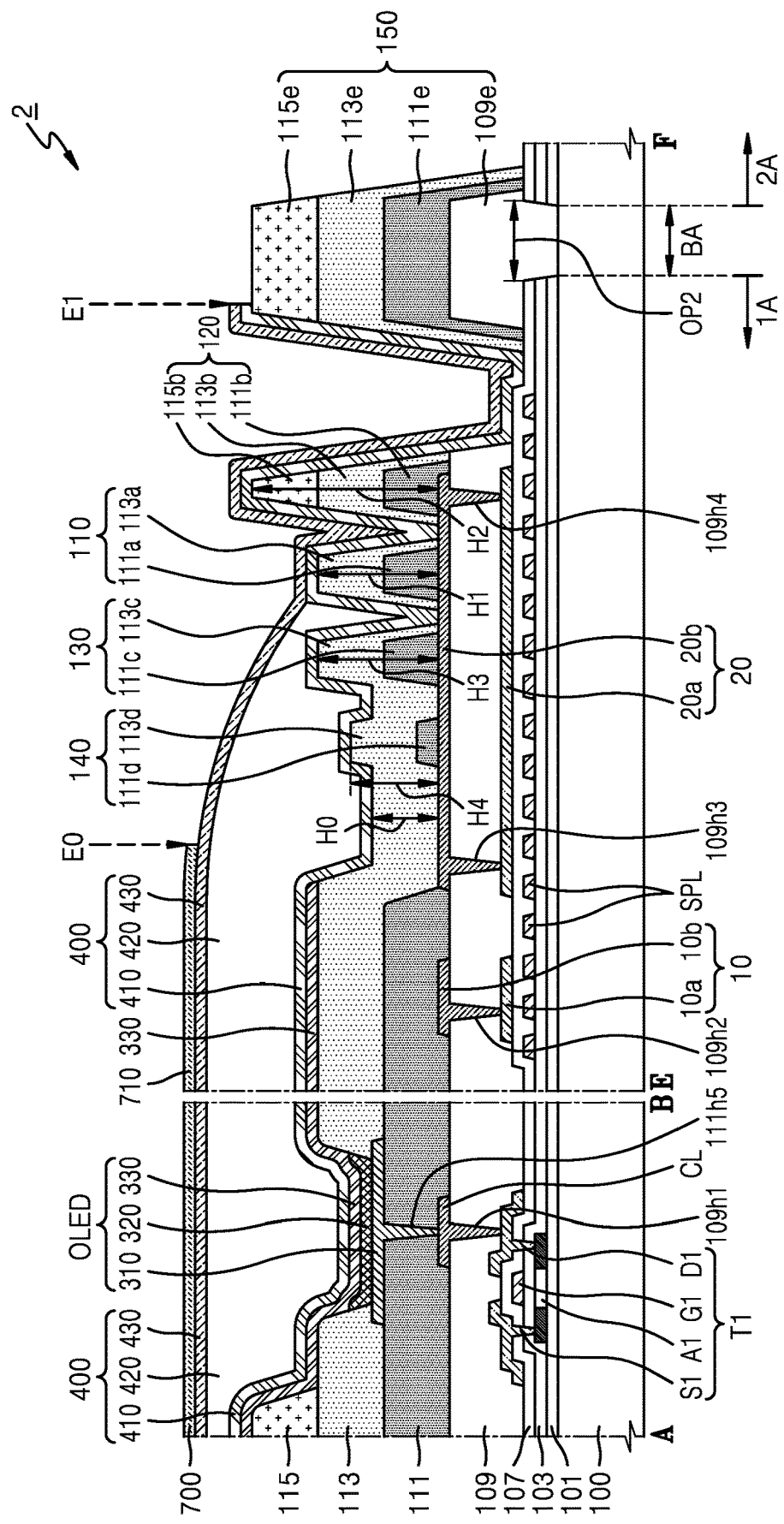
FIG. 9 is a schematic cross-sectional view of the display apparatus of FIG. 8 and illustrates a schematic cross-section of the display apparatus taken along line A-B of FIG. 3 and a schematic cross-section of the display apparatus taken along line E-F of FIG. 8.

FIG. 7 is a schematic perspective view of a display apparatus 2 according to an embodiment, FIG. 8 is a schematic plan view of the display apparatus 2 according to an embodiment, and FIG. 9 is a schematic cross-sectional view of the display apparatus 2 according to an embodiment and includes a schematic cross-section of the display apparatus 2 taken along line A-B of FIG. 3 and a cross-section of the display apparatus 2 taken along line E-F of FIG. 8.

The display apparatus 2 according to an embodiment will now be described below by focusing on differences from the above-described display apparatus 1.

Referring to FIGS. 7 through 9, the display apparatus 2 according to an embodiment includes a display area DA arranged on the substrate 100, and a non-display area NDA arranged around the display region. According to an embodiment, the non-display area NDA may include a bending area BA bent about a bending axis BAX.

The bending area BA may include an area having a radius of curvature after being bent. A first area 1A indicates the display area DA and the non-display area NDA adjacent to one end of the bending area BA, and a second area 2A may include the non-display area NDA adjacent to another end of the bending area BA.

According to an embodiment, the schematic cross-section of the display apparatus 2 taken along line A-B of FIG. 3 is identical to that of the display apparatus 1. An arrangement of the first, second, and third dams 110, 120, and 130 and an arrangement of the monitoring bank 140 within the non-display area NDA are the same as the above-described arrangements in the display apparatus 1. In other words, the height H4 of the monitoring bank 140 may be greater than the height H0 of the organic insulating layer 113 between the end E0 of the touch connection line 710 and the monitoring bank 140. In other words, a height difference may be provided between the upper surface of the monitoring bank 140 and the peripheral region around the monitoring bank 140, and a disposing location of an organic material discharged via an inkjet process near the monitoring bank 140 may be monitored. The height H4 of the monitoring bank 140 may be less than heights H1, H2, and H3 of the first, second, and third dams 110, 120, and 130, so as to let the first, second, and third dams 110, 120, and 130 block a flow of the organic encapsulation layer 420.

However, the display apparatus 2 according to an embodiment may further include the bending area BA including a second opening OP2, from which inorganic insulating layers such as the buffer layer 101, the gate insulating layer 103, and the interlayer insulating layer 107 have been removed. By removing the inorganic insulating layers such as the buffer layer 101, the gate insulating layer 103, and the interlayer insulating layer 107 from the bending area BA, the inorganic insulating layers may be prevented from cracking due to a bending stress.

A buffering bank 150 may be provided in the second opening OP2 provided in the bending area BA. The buffering bank 150 may include a first layer 109e, a second layer 111e, a third layer 113e, and a fourth layer 115e, wherein the first layer 109e and the first planarization layer 109 may include a same material, the second layer 111e and the second planarization layer 111 may include a same material, the third layer 113e and the organic insulating layer 113 may include a same material, and the fourth layer 115e and the spacer 115 may include a same material. Because the above-described inorganic insulating layers are removed from the second opening OP2, the first layer 109e of the buffering bank 150 on the second opening OP2 may directly contact the upper surface of the substrate 100.

The organic encapsulation layer 420 may be disposed between the first inorganic encapsulation layer 410 and the second inorganic encapsulation layer 430, and may planarize a structure of the display area DA and a peripheral portion of the display area DA. According to an embodiment, the first inorganic encapsulation layer 410 and the second inorganic encapsulation layer 430 may extend to the buffering bank 150 beyond the first, second, and third dams 110, 120, and 130. In other words, ends E1 of the first inorganic encapsulation layer 410 and the second inorganic encapsulation layer 430 may extend toward an outer side of the second dam 120, which is the outermost dam, thereby more effectively preventing permeation of moisture and oxygen. However, even in this case, the ends E1 of the first inorganic encapsulation layer 410 and the second inorganic encapsulation layer 430 are made not to extend beyond the bending area BA, thereby preventing the first inorganic encapsulation layer 410 and the second inorganic encapsulation layer 430 from cracking due to a bending stress.

According to embodiments of the disclosure, a monitoring bank having a height difference between a touch connection line and a dam may be formed, and the definition of the boundary of the monitoring bank may be observed, and thus a disposing location of the material of an organic encapsulation layer may be monitored. Of course, the scope of the disclosure is not limited thereto.

It should be understood that embodiments described herein should be considered in a descriptive sense only and not for purposes of limitation. Descriptions of features or aspects within each embodiment should typically be considered as available for other similar features or aspects in other embodiments. While some embodiments have been described with reference to the figures, it will be understood by those of ordinary skill in the art that various changes in form and details may be made therein without departing from the spirit and scope as defined by the following claims.

What is claimed is:

1. A flexible display apparatus comprising:
    a display area disposed on a substrate and including a plurality of pixels;
    a non-display area adjacent to the display area and including a bending area;
    a first dam surrounding the display area;
    a second dam disposed outside the first dam and surrounding the first dam;
    a monitoring bank disposed between the display area and the second dam;
    a buffering bank disposed outside the monitoring bank and covering an opening in a first insulating layer on the substrate in the bending area;
    a thin-film encapsulation layer covering the display area and a portion of the non-display area;
    a touch screen layer disposed on the thin-film encapsulation layer; and
    a touch connection line electrically connected to the touch screen layer and extending to the non-display area, wherein
    an end of the touch connection line is located closer to the display area than the monitoring bank is.

2. The flexible display apparatus of claim 1, wherein a height of the monitoring bank is less than a height of the first dam.

3. The flexible display apparatus of claim 1, wherein an organic insulating layer included in the buffering bank directly contacts the substrate via the opening in the bending area.

4. The flexible display apparatus of claim 1, wherein
    the thin-film encapsulation layer comprises:
        a first inorganic encapsulation layer;
        an organic encapsulation layer disposed on the first inorganic encapsulation layer; and
        a second inorganic encapsulation layer disposed on the organic encapsulation layer,
    the organic encapsulation layer is disposed inside the second dam, and
    the first inorganic encapsulation layer and the second inorganic encapsulation layer each extend over the second dam and cover a portion of the buffering bank.

5. The flexible display apparatus of claim 4, wherein an end of the first inorganic encapsulation layer and an end of the second inorganic encapsulation layer are located closer to the display area than the opening is.

6. The flexible display apparatus of claim 4, wherein the first insulating layer is directly on the substrate.

7. The flexible display apparatus of claim 6, wherein the first insulating layer comprises an inorganic material.

8. The flexible display apparatus of claim 6, wherein the opening extends into a second insulating layer disposed on the first insulating layer.

9. The flexible display apparatus of claim 8, wherein the second insulating layer comprises an inorganic material.

10. The flexible display apparatus of claim 8, wherein the opening extends into a third insulating layer disposed on the second insulating layer.

11. The flexible display apparatus of claim 10, wherein the third insulating layer comprises an inorganic material.

\* \* \* \* \*